United States Patent
Akashi et al.

(10) Patent No.: US 10,827,603 B2
(45) Date of Patent: Nov. 3, 2020

(54) PRINTED CIRCUIT SUBSTRATE (71) Applicant: Mitsubishi Electric Corporation, Chiyoda-ku (JP)

(72) Inventors: Norihiko Akashi, Chiyoda-ku (JP); Hiroyuki Ono, Chiyoda-ku (JP); Hiroshi Mihara, Chiyoda-ku (JP); Yoshiaki Irifune, Chiyoda-ku (JP); Daisuke Koyama, Chiyoda-ku (JP); Yudai Yoneoka, Chiyoda-ku (JP); Takashi Miyasaka, Chiyoda-ku (JP); Shimpei Kasahara, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/300,665

(22) PCT Filed: Dec. 8, 2016

(86) PCT No.: PCT/JP2016/086526
§ 371 (c)(1),
(2) Date: Nov. 12, 2018

(87) PCT Pub. No.: WO2017/221443
PCT Pub. Date: Dec. 28, 2017

(65) Prior Publication Data
US 2019/0394872 A1 Dec. 26, 2019

(30) Foreign Application Priority Data
Jun. 24, 2016 (JP) ................... 2016-125671

(51) Int. Cl.
*H05K 1/02* (2006.01)
(52) U.S. Cl.
CPC ... *H05K 1/0224* (2013.01); *H05K 2201/0979* (2013.01); *H05K 2201/09263* (2013.01);
(Continued)

(58) Field of Classification Search
CPC ....... H05K 1/0224; H05K 2201/09263; H05K 2201/09609; H05K 2201/09672;
(Continued)

(56) References Cited

U.S. PATENT DOCUMENTS

| | | | |
|---|---|---|---|
| 6,181,571 | B1 | 1/2001 | Sugimoto |
| 2002/0176236 | A1 | 11/2002 | Iguchi et al. |
| 2015/0008767 | A1 | 1/2015 | Shinoda et al. |

FOREIGN PATENT DOCUMENTS

| | | |
|---|---|---|
| JP | 9-27692 A | 1/1997 |
| JP | 11-297875 A | 10/1999 |

(Continued)

OTHER PUBLICATIONS

International Search Report dated Jan. 31, 2017 in PCT/JP2016/086526 filed Dec. 8, 2016.
(Continued)

*Primary Examiner* — Tremesha S Willis
(74) *Attorney, Agent, or Firm* — Xsensus LLP (57) ABSTRACT

A printed circuit substrate includes a circuit unit, a first main frame ground interconnection, a first sub frame ground interconnection spaced away from the first main frame ground interconnection in a first direction, and a first conductive via connecting the first main frame ground interconnection and the first sub frame ground interconnection to each other. In plan view from the first direction, a second outer periphery of the first sub frame ground interconnection is surrounded by a first outer periphery of the first main frame ground interconnection. Thus, a printed circuit substrate that can prevent the circuit unit from malfunctioning can be provided.

10 Claims, 8 Drawing Sheets (52) U.S. Cl.
CPC ............ *H05K 2201/09609* (2013.01); *H05K 2201/09672* (2013.01); *H05K 2201/10053* (2013.01); *H05K 2201/10189* (2013.01)

(58) Field of Classification Search
CPC . H05K 2201/0979; H05K 2201/10053; H05K 2201/10189
USPC ........................................................ 174/260
See application file for complete search history.

(56) References Cited

FOREIGN PATENT DOCUMENTS

| | | |
|---|---|---|
| JP | 2000-269613 A | 9/2000 |
| JP | 2003-163467 A | 6/2003 |
| JP | 2010-50298 A | 3/2010 |
| JP | 2014-36138 A | 2/2014 |
| WO | WO 2013/145019 A1 | 10/2013 |

OTHER PUBLICATIONS

Japanese Office Action dated Jun. 27, 2017 for Japanese Application 2017-515256 filed Mar. 17, 2017 (with English translation).
Korean Office Action dated Feb. 7, 2020 in Korean Patent Application No. 10-2018-7035729 with translation.
Office Action dated Jul. 13, 2020 in Indian Patent Application No. 201847045725, 7 pages.

PRINTED CIRCUIT SUBSTRATE

TECHNICAL FIELD

The present invention relates to a printed circuit substrate.

BACKGROUND ART

In recent years, a circuit unit on a printed circuit substrate has been downsized, with high-density signal interconnections and circuit components (e.g. IC components) mounted on the circuit unit. Accordingly, an electromagnetic noise such as static electricity tends to propagate from the outside of the printed circuit substrate to the circuit unit and cause the circuit unit to malfunction. In order to reduce an electromagnetic noise that propagates to a circuit unit, PTL 1 discloses a printed circuit substrate having a slit between a frame ground interconnection and a signal ground interconnection.

CITATION LIST

Patent Literature

PTL 1: Japanese Patent Laying-Open No. 2010-50298

SUMMARY OF INVENTION

Technical Problem

In the printed circuit substrate disclosed in PTL 1, a part of an electromagnetic noise that has propagated to a case containing an external interface propagates on a frame ground interconnection to a stable electric potential connected to the frame ground interconnection. However, the remaining part of the electromagnetic noise that has propagated to the case containing the external interface is spatially coupled to a circuit unit on the printed circuit substrate from the frame ground interconnection. The electromagnetic noise spatially coupled to the circuit unit may cause the circuit unit to malfunction. The present invention has been made in view of such a problem, and aims to provide a printed circuit substrate that can prevent a circuit unit from malfunctioning.

Solution to Problem

A printed circuit substrate of the present invention includes a circuit unit, a first main frame ground interconnection, a first sub frame ground interconnection spaced away from the first main frame ground interconnection in a first direction, and a first conductive via connecting the first main frame ground interconnection and the first sub frame ground interconnection to each other. In plan view from the first direction, a second outer periphery of the first sub frame ground interconnection is surrounded by a first outer periphery of the first main frame ground interconnection.

Advantageous Effects of Invention

In the printed circuit substrate of the present invention, the first sub frame ground interconnection is connected to the first main frame ground interconnection through the first conductive via. In plan view from the first direction, the second outer periphery of the first sub frame ground interconnection is surrounded by the first outer periphery of the first main frame ground interconnection. Accordingly, an electromagnetic noise that propagates on the first main frame ground interconnection is coupled to the first sub frame ground interconnection. A large part of an electromagnetic noise coupled to the first sub frame ground interconnection is converted into heat without being spatially coupled to the circuit unit. The printed circuit substrate of the present invention can prevent the circuit unit from malfunctioning.

DESCRIPTION OF EMBODIMENTS

Embodiments of the present invention are described hereinafter. Identical components are identically denoted, and the explanation thereof is not repeated.

Embodiment 1

Figure 1:
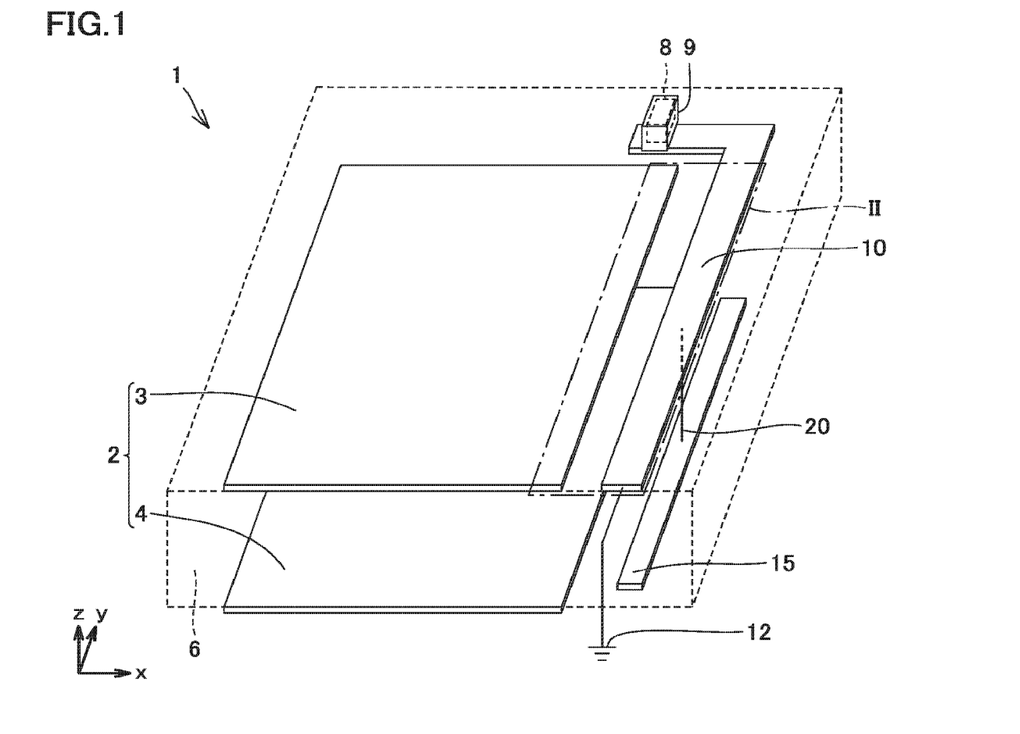
FIG. 1 is a perspective view of a printed circuit substrate according to an embodiment 1 of the present invention.
Figure 2:
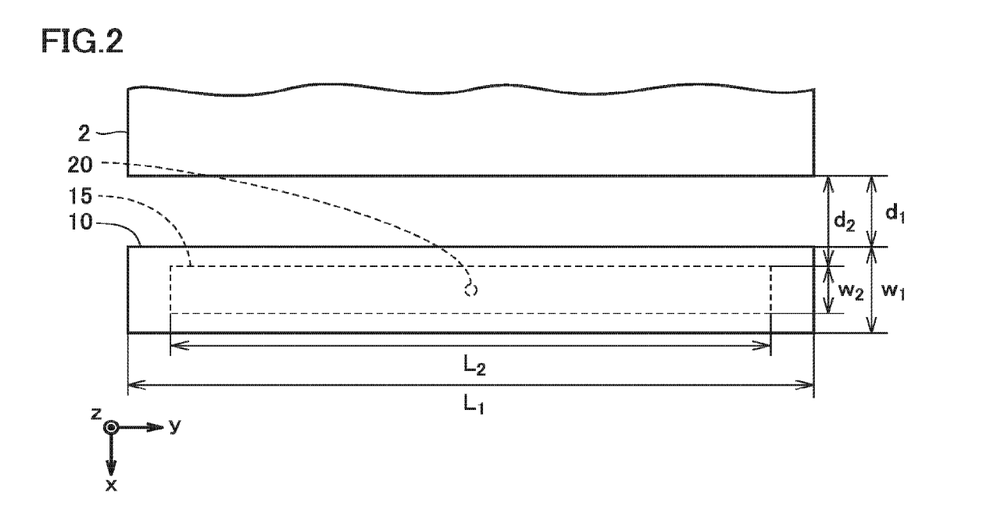
FIG. 2 is a schematic partially enlarged plan view of a region II shown in FIG. 1 of a printed circuit substrate according to embodiment 1 of the present invention.

With reference to FIG. 1 and FIG. 2, a printed circuit substrate 1 according to embodiment 1 is described. Printed circuit substrate 1 in the present embodiment mainly includes a dielectric layer 6, an external interface 8, a case 9, a circuit unit 2, a first main frame ground interconnection 10, a first sub frame ground interconnection 15, and a first conductive via 20.

External interface 8 may be, for example, a connector or a switch. Case 9 contains external interface 8.

Circuit unit 2 is electrically connected to external interface 8. A signal is transmitted from the outside of printed circuit substrate 1 to circuit unit 2 through external interface 8. Circuit unit 2 includes a first circuit subunit 3 and a second circuit subunit 4. First circuit subunit 3 may be provided on a first surface of dielectric layer 6. Second circuit subunit 4 may be provided on a second surface of dielectric layer 6 opposite to the first surface. Each of first circuit subunit 3 and second circuit subunit 4 includes circuit components such as a signal interconnection, a power supply interconnection, a signal ground interconnection, and an IC component, for example.

Second circuit subunit 4 may be spaced away from first circuit subunit 3 in a first direction (for example, z direction). Each of first circuit subunit 3 and second circuit subunit 4 may extend in a second direction (for example, x direction) and a third direction (for example, y direction). The second direction is a direction intersecting the first direction. In particular, the second direction is a direction orthogonal to the first direction. The third direction is a direction intersecting the first direction and the second direction. In particular, the third direction is a direction orthogonal to the first direction and the second direction.

Circuit unit 2 is spaced away from first main frame ground interconnection 10, first sub frame ground interconnection 15, and first conductive via 20 in the second direction intersecting the first direction. In plan view from the first direction, circuit unit 2 may be disposed at the central region of printed circuit substrate 1.

First main frame ground interconnection 10 is electrically connected to case 9. In particular, first main frame ground interconnection 10 is connected to case 9 at one end of first main frame ground interconnection 10. First main frame ground interconnection 10 is connected to stable electric potential 12. In particular, first main frame ground interconnection 10 is connected to stable electric potential 12 at the other end of first main frame ground interconnection 10 opposite to the one end. Stable electric potential 12 may be, for example, an earth electric potential, or may be an electric potential of a housing (not shown) containing printed circuit substrate 1.

First main frame ground interconnection 10 is spaced away from circuit unit 2 in the second direction (for example, x direction) intersecting the first direction. As shown in FIG. 2, in plan view from the first direction, first main frame ground interconnection 10 is spaced away from circuit unit 2 at a distance of $d_1$. First main frame ground interconnection 10 may be provided on the first surface of dielectric layer 6. First main frame ground interconnection 10 may be coplanar with first circuit subunit 3. In plan view from the first direction, first main frame ground interconnection 10 may be disposed at a peripheral region of printed circuit substrate 1. In plan view from the first direction, first main frame ground interconnection 10 may have, but is not limited to, an L shape, for example.

First sub frame ground interconnection 15 is spaced away from first main frame ground interconnection 10 in the first direction so as to be opposite to first main frame ground interconnection 10. As shown in FIG. 2, in plan view from the first direction, first sub frame ground interconnection 15 is spaced away from circuit unit 2 at a distance of $d_2$. Distance $d_2$ may be larger than distance $d_1$. First sub frame ground interconnection 15 may be provided on the second surface of dielectric layer 6. First sub frame ground interconnection 15 may be coplanar with second circuit subunit 4. In plan view from the first direction, first sub frame ground interconnection 15 may be disposed at a peripheral region of printed circuit substrate 1.

With reference to FIG. 2, in plan view from the first direction, first sub frame ground interconnection 15 coincides in position with first main frame ground interconnection 10. In plan view from the first direction, a second outer periphery of first sub frame ground interconnection 15 is surrounded by a first outer periphery of first main frame ground interconnection 10. A length $L_2$ of first sub frame ground interconnection 15 in the longitudinal direction may be shorter than a length $L_1$ of first main frame ground interconnection 10 in the longitudinal direction. A width $w_2$ of first sub frame ground interconnection 15 may be narrower than a width $w_1$ of first main frame ground interconnection 10. In plan view from the first direction, first sub frame ground interconnection 15 may be smaller in area than first main frame ground interconnection 10.

First conductive via 20 connects first main frame ground interconnection 10 and first sub frame ground interconnection 15 to each other. First conductive via 20 is connected to first main frame ground interconnection 10 between one end (the end on the case 9 side) and the other end (the end on the stable electric potential 12 side) of first main frame ground interconnection 10. First conductive via 20 may be formed so as to pass through dielectric layer 6.

Printed circuit substrate 1 in the present embodiment can inhibit an electromagnetic noise that propagates to case 9 containing external interface 8 from being spatially coupled to circuit unit 2. Specifically, an electromagnetic noise that propagates to case 9 propagates on first main frame ground interconnection 10 electrically connected to case 9. First sub frame ground interconnection 15 is connected to first main frame ground interconnection 10 through first conductive via 20. Accordingly, a large part of an electromagnetic noise that propagates from case 9 containing external interface 8 through first main frame ground interconnection 10 is coupled to first sub frame ground interconnection 15 without being spatially coupled to circuit unit 2.

In particular, first sub frame ground interconnection 15 may be configured so that an electromagnetic noise that propagates on first main frame ground interconnection 10 is resonantly coupled to first sub frame ground interconnection 15. First sub frame ground interconnection 15 configured as such can more strongly electrically couple an electromagnetic noise that propagates on first main frame ground interconnection 10 to first sub frame ground interconnection 15, and can more strongly confine, to the inside of first sub frame ground interconnection 15, an electromagnetic noise that propagates on first main frame ground interconnection 10. Therefore, first sub frame ground interconnection 15, which is configured to allow an electromagnetic noise that propagates on first main frame ground interconnection 10 to be resonantly coupled to first sub frame ground interconnection 15, can more reliably inhibit an electromagnetic noise that propagates on first main frame ground interconnection 10 from being spatially coupled to circuit unit 2.

By appropriately determining, for example, a capacitance between first main frame ground interconnection 10 and first sub frame ground interconnection 15, and an electric resistance of first sub frame ground interconnection 15, first sub frame ground interconnection 15 can be configured so that an electromagnetic noise that propagates on first main frame ground interconnection 10 is resonantly coupled to first sub frame ground interconnection 15. For example, by appropriately determining length $L_2$ and width $w_2$ of first sub frame ground interconnection 15, the position of first sub frame ground interconnection 15 relative to first main frame ground interconnection 10, and the position of first conductive via 20 relative to first main frame ground interconnection 10 and first sub frame ground interconnection 15, first sub frame ground interconnection 15 can be configured so that an electromagnetic noise that propagates on first main frame ground interconnection 10 is resonantly coupled to first sub frame ground interconnection 15.

An electromagnetic noise coupled (preferably resonantly coupled) to first sub frame ground interconnection 15 is converted into heat in response to a conductor resistance loss at first sub frame ground interconnection 15 and a dielectric loss at dielectric layer 6 around first sub frame ground interconnection 15. Thus, an electromagnetic noise that propagates from case 9 containing external interface 8 to first main frame ground interconnection 10 can be inhibited from being spatially coupled to circuit unit 2. Printed circuit substrate 1 in the present embodiment can prevent circuit unit 2 from malfunctioning.

An electromagnetic noise may be, for example, static electricity. An electromagnetic noise may have a frequency of, for example, not less than 1 kHz and not more than 10 GHz. A partial electromagnetic noise that has not been coupled to first sub frame ground interconnection 15 propagates to stable electric potential 12 through first main frame ground interconnection 10. A partial electromagnetic noise that has not been coupled to first sub frame ground interconnection 15 can be prevented from being coupled to circuit unit 2.

Figure 3:
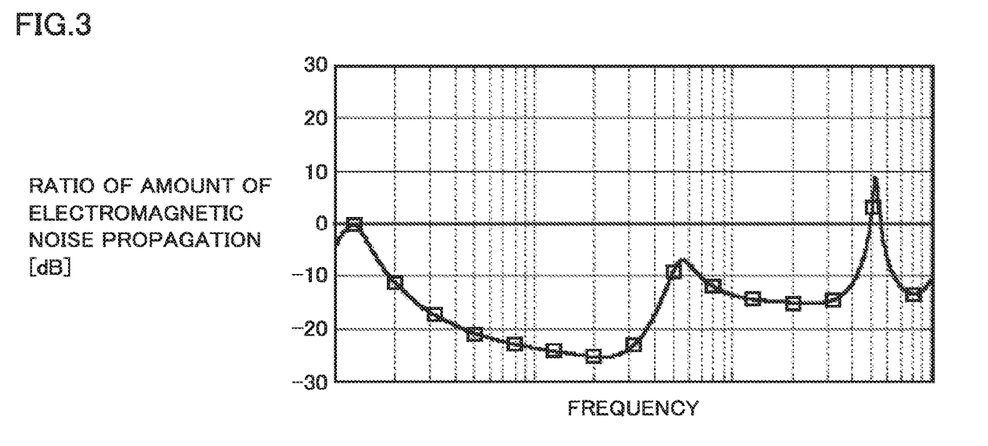
FIG. 3 shows a semilog graph representing the results of analysis of the amount of electromagnetic noise propagation in a printed circuit substrate according to embodiment 1 of the present invention.

FIG. 3 shows the results of analysis of the amount of electromagnetic noise propagation in printed circuit substrate 1 in the present embodiment. The vertical axis represents the ratio of the amount of electromagnetic noise propagation to circuit unit 2, and the horizontal axis represents the frequency shown on a log scale. The ratio of the amount of electromagnetic noise propagation to circuit unit 2 is defined as a logarithm of a value obtained by dividing an amount of electromagnetic noise propagation to circuit unit 2 in printed circuit substrate 1 in the present embodiment by an amount of electromagnetic noise propagation to circuit unit 2 in a printed circuit substrate in a comparative example with no first sub frame ground interconnection 15 and no first conductive via 20. The ratio of the amount of electromagnetic noise propagation to circuit unit 2 in printed circuit substrate 1 in the present embodiment being 0 dB means that the amount of electromagnetic noise propagation to circuit unit 2 in printed circuit substrate 1 in the present embodiment is equal to the amount of electromagnetic noise propagation to circuit unit 2 in a printed circuit substrate in a comparative example.

As shown in FIG. 3, the amount of electromagnetic noise propagation to circuit unit 2 in printed circuit substrate 1 in the present embodiment is less, over a wide frequency band, than the amount of electromagnetic noise propagation to circuit unit 2 in a printed circuit substrate in a comparative example. Printed circuit substrate 1 in the present embodiment can prevent an electromagnetic noise (e.g. static electricity) from propagating to circuit unit 2, and thus can prevent circuit unit 2 from malfunctioning.

The advantageous effects of printed circuit substrate 1 in the present embodiment are described.

Printed circuit substrate 1 in the present embodiment includes external interface 8, case 9 containing external interface 8, circuit unit 2, first main frame ground interconnection 10, first sub frame ground interconnection 15, and first conductive via 20. Circuit unit 2 is electrically connected to external interface 8. First main frame ground interconnection 10 is electrically connected to case 9. First sub frame ground interconnection 15 is spaced away from first main frame ground interconnection 10 in the first direction so as to be opposite to first main frame ground interconnection 10. First conductive via 20 connects first main frame ground interconnection 10 and first sub frame ground interconnection 15 to each other. Circuit unit 2 is spaced away from first main frame ground interconnection 10, first sub frame ground interconnection 15, and first conductive via 20 in the second direction intersecting the first direction. In plan view from the first direction, the second outer periphery of first sub frame ground interconnection 15 is surrounded by the first outer periphery of first main frame ground interconnection 10.

In printed circuit substrate 1 in the present embodiment, first sub frame ground interconnection 15 is connected to first main frame ground interconnection 10 through first conductive via 20. In plan view from the first direction, the second outer periphery of first sub frame ground interconnection 15 is surrounded by the first outer periphery of first main frame ground interconnection 10. Therefore, a large part of an electromagnetic noise that propagates from case 9 through first main frame ground interconnection 10 is coupled to first sub frame ground interconnection 15 without being spatially coupled to circuit unit 2. An electromagnetic noise coupled to first sub frame ground interconnection 15 is converted into heat in response to a conductor resistance loss at first sub frame ground interconnection 15 and a dielectric loss at dielectric layer 6 around first sub frame ground interconnection 15. Thus, an electromagnetic noise that propagates from case 9 containing external interface 8 to first main frame ground interconnection 10 can be inhibited from being spatially coupled to circuit unit 2. Printed circuit substrate 1 in the present embodiment can prevent circuit unit 2 from malfunctioning.

In printed circuit substrate 1 in the present embodiment, in plan view from the first direction, the second outer periphery of first sub frame ground interconnection 15 is surrounded by the first outer periphery of first main frame ground interconnection 10. Circuit unit 2, first main frame ground interconnection 10, and first sub frame ground interconnection 15 can be compactly arranged. Printed circuit substrate 1 in the present embodiment can be downsized.

In printed circuit substrate 1 in the present embodiment, first sub frame ground interconnection 15 may be configured so that an electromagnetic noise that propagates on first main frame ground interconnection 10 is resonantly coupled to first sub frame ground interconnection 15. First sub frame ground interconnection 15 configured as such can more strongly electrically couple an electromagnetic noise that propagates on first main frame ground interconnection 10 to first sub frame ground interconnection 15, and can more strongly confine, to the inside of first sub frame ground interconnection 15, an electromagnetic noise that propagates on first main frame ground interconnection 10. Therefore, first sub frame ground interconnection 15, which is configured to allow an electromagnetic noise that propagates on first main frame ground interconnection 10 to be resonantly coupled to first sub frame ground interconnection 15, can more reliably inhibit an electromagnetic noise that propagates on first main frame ground interconnection 10 from being spatially coupled to circuit unit 2. Printed circuit substrate 1 in the present embodiment can more reliably prevent circuit unit 2 from malfunctioning.

Embodiment 2

Figure 4:
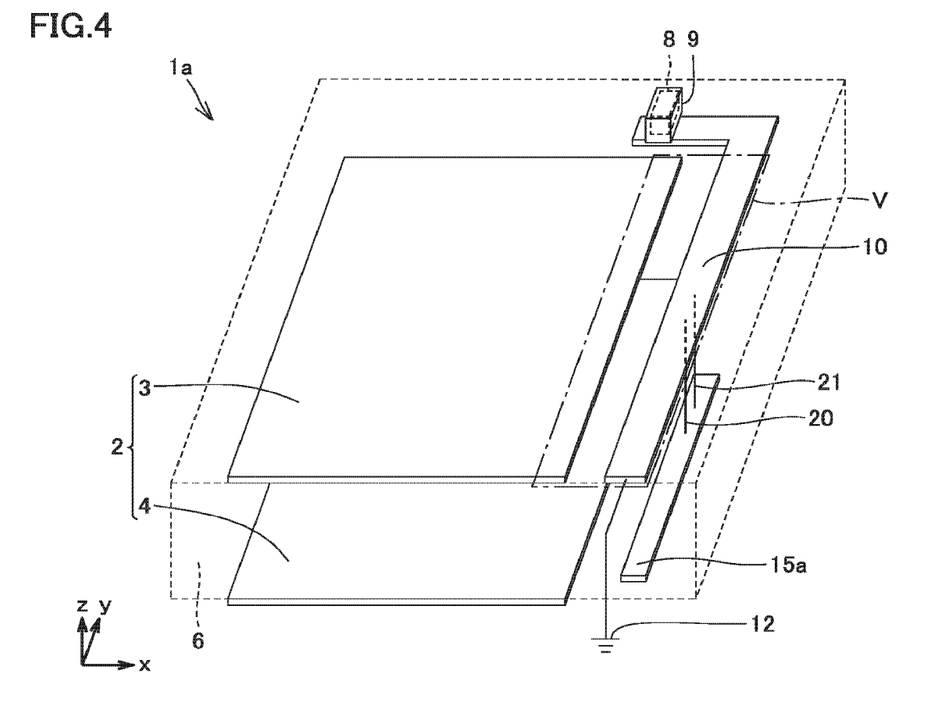
FIG. 4 is a perspective view of a printed circuit substrate according to an embodiment 2 of the present invention.
Figure 5:
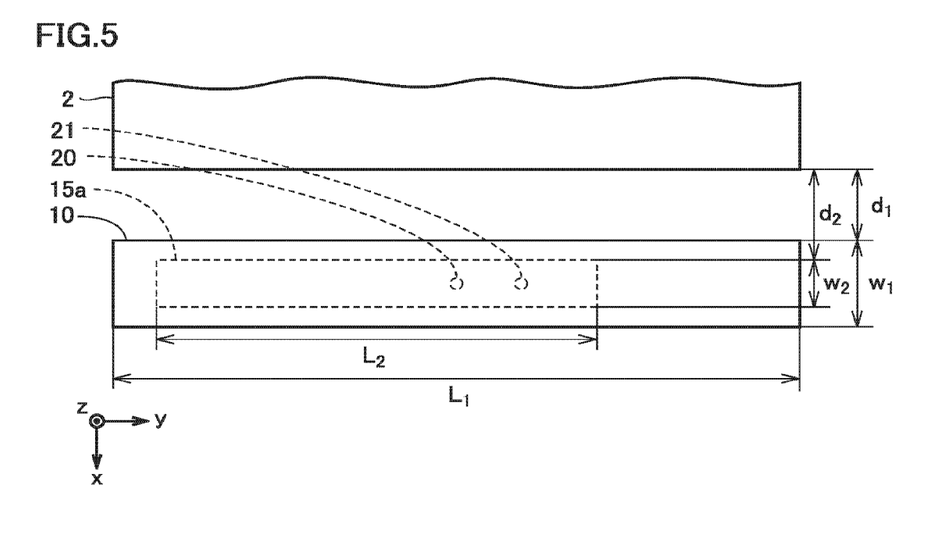
FIG. 5 is a schematic partially enlarged plan view of a region V shown in FIG. 4 of a printed circuit substrate according to embodiment 2 of the present invention.

With reference to FIG. 4 and FIG. 5, a printed circuit substrate 1a according to embodiment 2 is described.

Printed circuit substrate 1a in the present embodiment is similar in configuration to printed circuit substrate 1 in embodiment 1, but is different from the latter mainly in the following respects.

Printed circuit substrate 1a in the present embodiment further includes a second conductive via 21 connecting first main frame ground interconnection 10 and a first sub frame ground interconnection 15a to each other. First sub frame ground interconnection 15a is connected to first main frame ground interconnection 10 through first conductive via 20 and second conductive via 21. Second conductive via 21 may be formed so as to pass through dielectric layer 6.

First sub frame ground interconnection 15a in the present embodiment is different in shape from first sub frame ground interconnection 15 in embodiment 1. Specifically, length $L_2$ of first sub frame ground interconnection 15a in the present embodiment in the longitudinal direction is shorter than length $L_2$ of first sub frame ground interconnection 15 in embodiment 1 in the longitudinal direction.

Printed circuit substrate 1a in the present embodiment further includes second conductive via 21 connecting first main frame ground interconnection 10 and first sub frame ground interconnection 15a to each other. Second conductive via 21 can make the frequency of electromagnetic noise coupled (preferably resonantly coupled) to first sub frame ground interconnection 15a different from the frequency of electromagnetic noise coupled (preferably resonantly coupled) to first sub frame ground interconnection 15 in embodiment 1. Second conductive via 21 can more strongly electrically couple an electromagnetic noise that propagates on first main frame ground interconnection 10 to first sub frame ground interconnection 15a. According to printed circuit substrate 1a in the present embodiment, the frequency of electromagnetic noise coupled to first sub frame ground interconnection 15a can be adjusted, and an electromagnetic noise that is spatially coupled to circuit unit 2 can be further reduced. Printed circuit substrate 1a in the present embodiment can more reliably prevent circuit unit 2 from malfunctioning.

First sub frame ground interconnection 15a in the present embodiment is different in shape from first sub frame ground interconnection 15 in embodiment 1. First sub frame ground interconnection 15a can make the frequency of electromagnetic noise coupled (preferably resonantly coupled) to first sub frame ground interconnection 15a different from the frequency of electromagnetic noise coupled (preferably resonantly coupled) to first sub frame ground interconnection 15 in embodiment 1. According to printed circuit substrate 1a in the present embodiment, the frequency of electromagnetic noise coupled to first sub frame ground interconnection 15a can be adjusted, and an electromagnetic noise that is spatially coupled to circuit unit 2 can be further reduced. Printed circuit substrate 1a in the present embodiment can more reliably prevent circuit unit 2 from malfunctioning.

Embodiment 3

Figure 6:
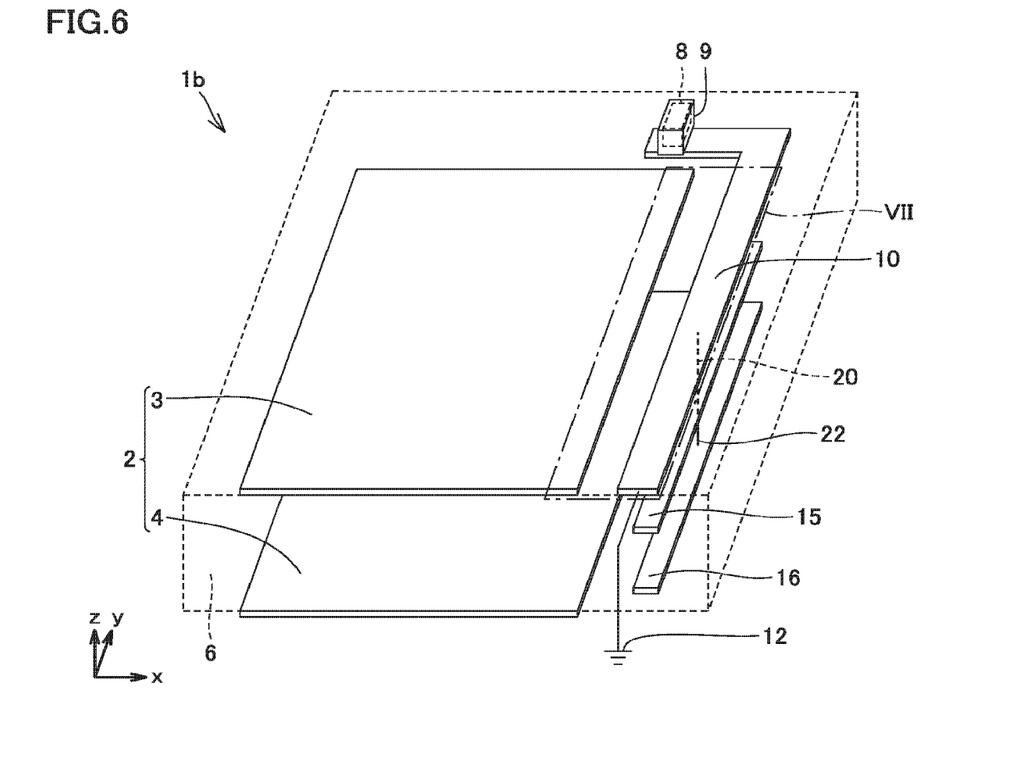
FIG. 6 is a perspective view of a printed circuit substrate according to an embodiment 3 of the present invention.
Figure 7:
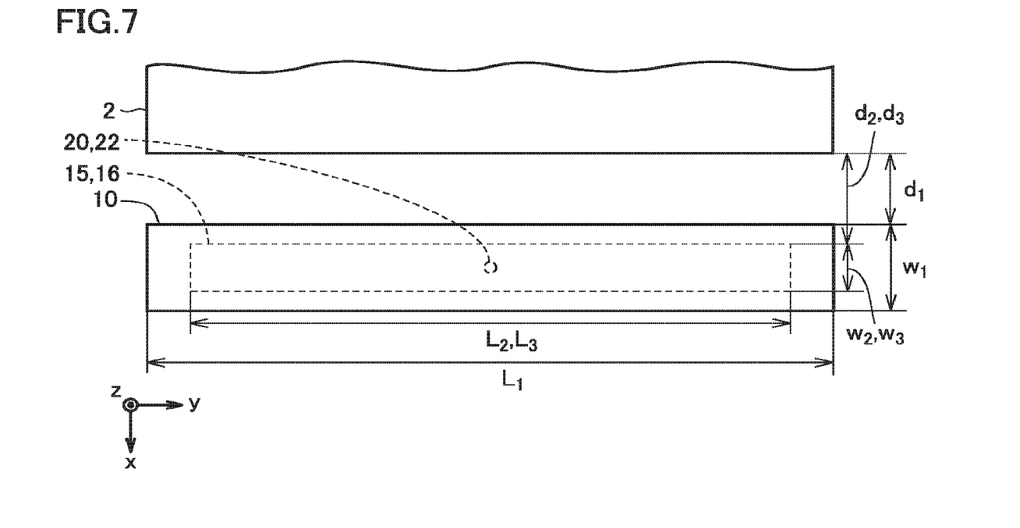
FIG. 7 is a schematic partially enlarged plan view of a region VII shown in FIG. 6 of a printed circuit substrate according to embodiment 3 of the present invention.

With reference to FIG. 6 and FIG. 7, a printed circuit substrate 1b according to embodiment 3 is described. Printed circuit substrate 1b in the present embodiment is similar in configuration to printed circuit substrate 1 in embodiment 1, but is different from the latter mainly in the following respects.

Printed circuit substrate 1b in the present embodiment further includes a second sub frame ground interconnection 16 and a third conductive via 22.

Second sub frame ground interconnection 16 is spaced away from first sub frame ground interconnection 15 in the first direction so as to be opposite to first sub frame ground interconnection 15. Second sub frame ground interconnection 16 is spaced away from first main frame ground interconnection 10 in the first direction so as to be opposite to first main frame ground interconnection 10. As shown in FIG. 7, in plan view from the first direction, second sub frame ground interconnection 16 is spaced away from circuit unit 2 at a distance of $d_3$. Distance $d_3$ may be larger than distance $d_1$. Distance $d_3$ may be equal to or may be different from distance $d_2$. Second sub frame ground interconnection 16 may be provided on the second surface of dielectric layer 6. Second sub frame ground interconnection 16 may be coplanar with second circuit subunit 4. In plan view from the first direction, second sub frame ground interconnection 16 may be disposed at a peripheral region of printed circuit substrate 1b.

First sub frame ground interconnection 15 is disposed between first main frame ground interconnection 10 and second sub frame ground interconnection 16. For example, first sub frame ground interconnection 15 may be located intermediate between first main frame ground interconnection 10 and second sub frame ground interconnection 16 in the first direction. First sub frame ground interconnection 15 may be embedded in dielectric layer 6. First sub frame ground interconnection 15 may be disposed at an intermediate portion of dielectric layer 6 in the first direction.

With reference to FIG. 7, in plan view from the first direction, second sub frame ground interconnection 16 coincides in position with first main frame ground interconnection 10. In plan view from the first direction, a third outer periphery of second sub frame ground interconnection 16 is surrounded by the first outer periphery of first main frame ground interconnection 10. A length $L_3$ of second sub frame ground interconnection 16 in the longitudinal direction may be shorter than length $L_1$ of first main frame ground interconnection 10 in the longitudinal direction. A width $w_3$ of second sub frame ground interconnection 16 may be narrower than width $w_1$ of first main frame ground interconnection 10. In plan view from the first direction, second sub frame ground interconnection 16 may be smaller in area than first main frame ground interconnection 10.

In plan view from the first direction, second sub frame ground interconnection 16 may be different from or may be the same as first sub frame ground interconnection 15 in shape. In plan view from the first direction, second sub frame ground interconnection 16 may be different from or may be the same as first sub frame ground interconnection 15 in area.

Third conductive via 22 connects first sub frame ground interconnection 15 and second sub frame ground interconnection 16 to each other. In plan view from the first direction, third conductive via 22 may coincide in position with first conductive via 20. Third conductive via 22 may be integrated with first conductive via 20.

Printed circuit substrate 1b in the present embodiment brings about the following advantageous effects in addition to the advantageous effects of printed circuit substrate 1 in embodiment 1.

Printed circuit substrate 1b in the present embodiment further includes second sub frame ground interconnection 16 and third conductive via 22. Second sub frame ground interconnection 16 is spaced away from first sub frame ground interconnection 15 in the first direction so as to be opposite to first sub frame ground interconnection 15. Third conductive via 22 connects first sub frame ground interconnection 15 and second sub frame ground interconnection 16 to each other. First sub frame ground interconnection 15 is disposed between first main frame ground interconnection 10 and second sub frame ground interconnection 16. In plan view from the first direction, the third outer periphery of second sub frame ground interconnection 16 is surrounded by the first outer periphery of first main frame ground interconnection 10.

In printed circuit substrate 1b in the present embodiment, first sub frame ground interconnection 15 is connected to first main frame ground interconnection 10 through first conductive via 20. Second sub frame ground interconnection 16 is connected to first main frame ground interconnection 10 through first conductive via 20 and third conductive via 22. In plan view from the first direction, the second outer periphery of first sub frame ground interconnection 15 and the third outer periphery of second sub frame ground interconnection 16 are surrounded by the first outer periphery of first main frame ground interconnection 10. Accordingly, a large part of an electromagnetic noise that propagates from case 9 through first main frame ground interconnection 10 is coupled to first sub frame ground interconnection 15 and second sub frame ground interconnection 16 without being spatially coupled to circuit unit 2.

An electromagnetic noise coupled to first sub frame ground interconnection 15 and second sub frame ground interconnection 16 is converted into heat in response to a conductor resistance loss at first sub frame ground interconnection 15 and second sub frame ground interconnection 16 and in response to a dielectric loss at dielectric layer 6 around first sub frame ground interconnection 15 and second sub frame ground interconnection 16. Thus, an electromagnetic noise that propagates from case 9 containing external interface 8 to first main frame ground interconnection 10 can be inhibited from being spatially coupled to circuit unit 2. Printed circuit substrate 1b in the present embodiment can more reliably prevent circuit unit 2 from malfunctioning.

Printed circuit substrate 1b in the present embodiment includes second sub frame ground interconnection 16 in addition to first sub frame ground interconnection 15. First sub frame ground interconnection 15 and second sub frame ground interconnection 16 can make the frequency of electromagnetic noise coupled (preferably resonantly coupled) to first sub frame ground interconnection 15 and second sub frame ground interconnection 16 different from the frequency of electromagnetic noise coupled (preferably resonantly coupled) to first sub frame ground interconnection 15 in embodiment 1. According to printed circuit substrate 1b in the present embodiment, the frequency of electromagnetic noise coupled to first sub frame ground interconnection 15 and second sub frame ground interconnection 16 can be adjusted, and an electromagnetic noise that is spatially coupled to circuit unit 2 can be further reduced. Printed circuit substrate 1b in the present embodiment can more reliably prevent circuit unit 2 from malfunctioning.

In printed circuit substrate 1b in the present embodiment, in plan view from the first direction, second sub frame ground interconnection 16 may be different in shape from first sub frame ground interconnection 15. Making second sub frame ground interconnection 16 different in shape from first sub frame ground interconnection 15 enables adjustment of the frequency of electromagnetic noise coupled to first sub frame ground interconnection 15 and second sub frame ground interconnection 16 over a broader frequency range, and enables further reduction in electromagnetic noise that is spatially coupled to circuit unit 2. Printed circuit substrate 1b in the present embodiment can more reliably prevent circuit unit 2 from malfunctioning.

In printed circuit substrate 1b in the present embodiment, in plan view from the first direction, the second outer periphery of first sub frame ground interconnection 15 and the third outer periphery of second sub frame ground interconnection 16 are surrounded by the first outer periphery of first main frame ground interconnection 10. Circuit unit 2, first main frame ground interconnection 10, first sub frame ground interconnection 15, and second sub frame ground interconnection 16 can be compactly arranged. Printed circuit substrate 1b in the present embodiment can be downsized.

Embodiment 4

Figure 8:
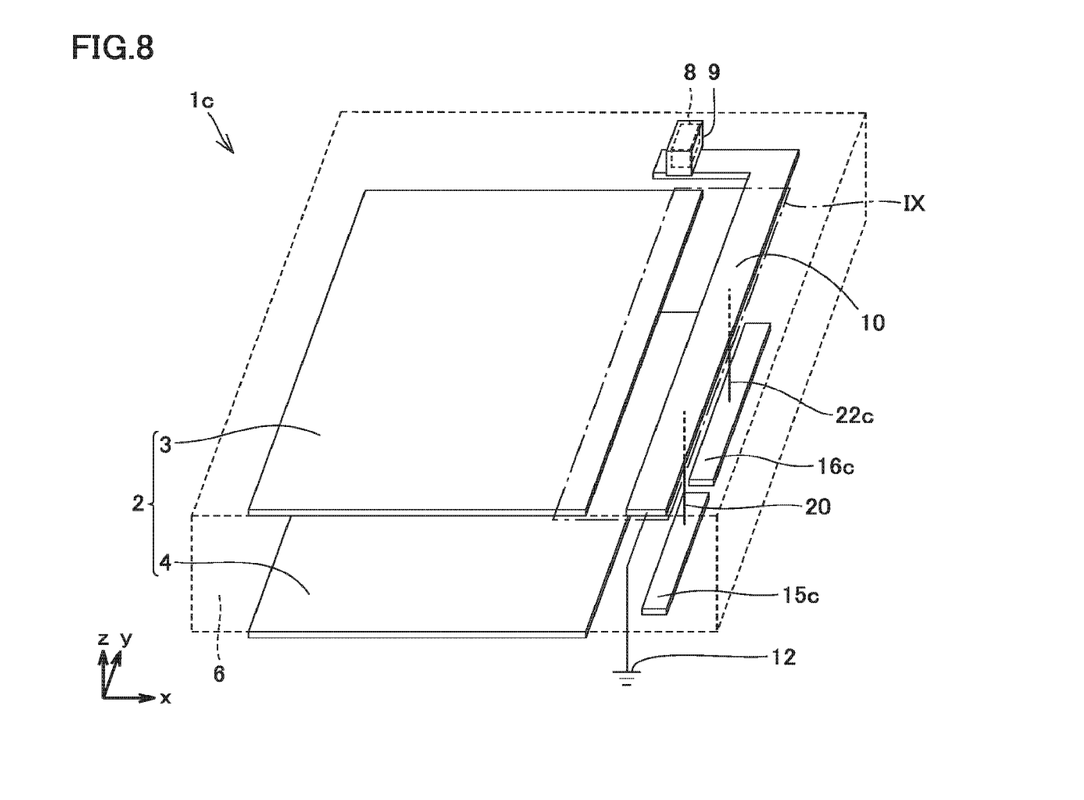
FIG. 8 is a perspective view of a printed circuit substrate according to an embodiment 4 of the present invention.
Figure 9:
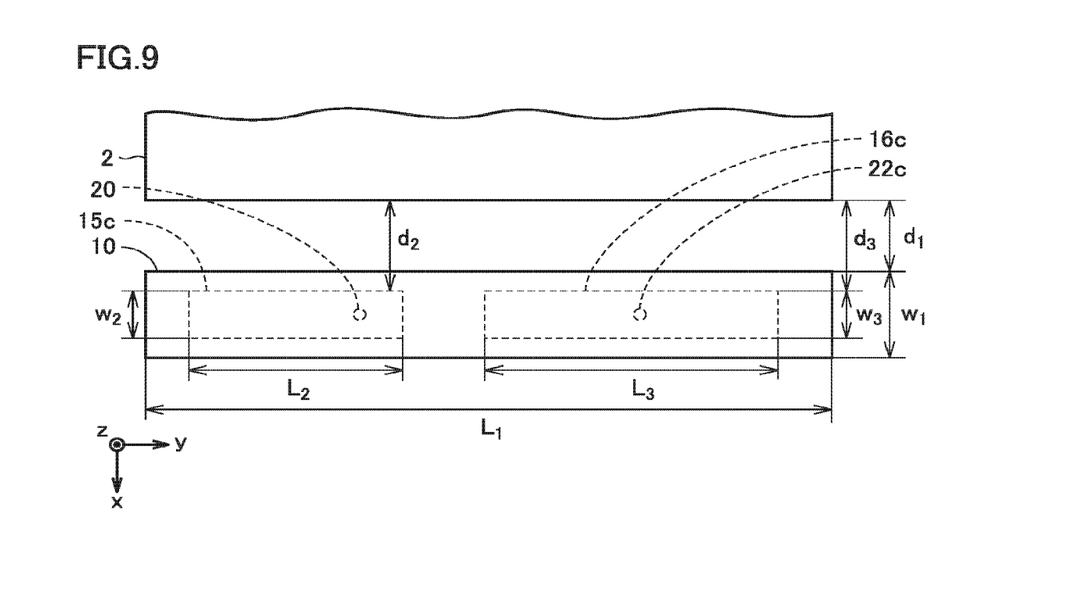
FIG. 9 is a schematic partially enlarged plan view of a region IX shown in FIG. 8 of a printed circuit substrate according to embodiment 4 of the present invention.

With reference to FIG. 8 and FIG. 9, a printed circuit substrate 1c according to embodiment 4 is described. Printed circuit substrate 1c in the present embodiment is similar in configuration to printed circuit substrate 1 in embodiment 1, but is different from the latter mainly in the following respects.

A first sub frame ground interconnection 15c in the present embodiment is different in shape from first sub frame ground interconnection 15 in embodiment 1. Specifically, length $L_2$ of first sub frame ground interconnection 15c in the present embodiment in the longitudinal direction is shorter than length $L_2$ of first sub frame ground interconnection 15 in embodiment 1 in the longitudinal direction.

Printed circuit substrate 1c in the present embodiment further includes a second sub frame ground interconnection 16c and a third conductive via 22c.

Second sub frame ground interconnection 16c is spaced away from first main frame ground interconnection 10 in the first direction so as to be opposite to first main frame ground interconnection 10. Second sub frame ground interconnection 16c is spaced away from first sub frame ground interconnection 15c in the third direction (y direction) intersecting the first direction (z direction) and the second direction (x direction). As shown in FIG. 9, in plan view from the first direction, second sub frame ground interconnection 16c is spaced away from circuit unit 2 at a distance of $d_3$. Distance $d_3$ may be larger than distance $d_1$. Distance $d_3$ may be equal to or may be different from distance $d_2$.

Second sub frame ground interconnection 16c may be provided on the second surface of dielectric layer 6. Second sub frame ground interconnection 16c may be coplanar with second circuit subunit 4. Second sub frame ground interconnection 16c may be coplanar with first sub frame ground interconnection 15c. In plan view from the first direction, second sub frame ground interconnection 16c may be disposed at a peripheral region of printed circuit substrate 1c.

With reference to FIG. 9, in plan view from the first direction, first sub frame ground interconnection 15c and second sub frame ground interconnection 16c coincide in position with first main frame ground interconnection 10. In plan view from the first direction, the second outer periphery of first sub frame ground interconnection 15c and the third outer periphery of second sub frame ground interconnection 16c are surrounded by the first outer periphery of first main frame ground interconnection 10. Each of length $L_2$ of first sub frame ground interconnection 15c in the longitudinal direction and length $L_3$ of second sub frame ground interconnection 16c in the longitudinal direction may be shorter than length $L_1$ of first main frame ground interconnection 10 in the longitudinal direction. Each of width $w_2$ of first sub frame ground interconnection 15c and width $w_3$ of second sub frame ground interconnection 16c may be narrower than width $w_1$ of first main frame ground interconnection 10. In plan view from the first direction, each of first sub frame ground interconnection 15c and second sub frame ground interconnection 16c may be smaller in area than first main frame ground interconnection 10.

In plan view from the first direction, second sub frame ground interconnection 16c may be different from or may be the same as first sub frame ground interconnection 15c in shape. In plan view from the first direction, second sub frame ground interconnection 16c may be different from or may be the same as first sub frame around interconnection 15c in area.

First conductive via 20 connects first main frame ground interconnection 10 and first sub frame ground interconnection 15c to each other. First conductive via 20 is connected to first main frame ground interconnection 10 between one end (the end on the case 9 side) and the other end (the end on the stable electric potential 12 side) of first main frame ground interconnection 10.

Third conductive via 22c connects first main frame ground interconnection 10 and second sub frame ground interconnection 16c to each other. Third conductive via 22c is connected to first main frame ground interconnection 10 between one end (the end on the case 9 side) and the other end (the end on the stable electric potential 12 side) of first main frame ground interconnection 10. Third conductive via 22c may be formed so as to pass through dielectric layer 6.

Printed circuit substrate 1c in the present embodiment brings about the following advantageous effects in addition to the advantageous effects of printed circuit substrate 1 in embodiment 1.

Printed circuit substrate 1c in the present embodiment further includes second sub frame ground interconnection 16c and third conductive via 22c. Second sub frame ground interconnection 16c is spaced away from first main frame ground interconnection 10 in the first direction so as to be opposite to first main frame ground interconnection 10. Third conductive via 22c connects first main frame ground interconnection 10 and second sub frame ground interconnection 16c to each other. Second sub frame ground interconnection 16c is spaced away from first sub frame ground interconnection 15c in the third direction intersecting the first direction and the second direction. In plan view from the first direction, the third outer periphery of second sub frame ground interconnection 16c is surrounded by the first outer periphery of first main frame ground interconnection 10.

In printed circuit substrate 1c in the present embodiment, first sub frame ground interconnection 15c is connected to first main frame ground interconnection 10 through first conductive via 20. Second sub frame ground interconnection 16c is connected to first main frame ground interconnection 10 through third conductive via 22c. In plan view from the first direction, the second outer periphery of first sub frame ground interconnection 15c and the third outer periphery of second sub frame ground interconnection 16c are surrounded by the first outer periphery of first main frame ground interconnection 10. Accordingly, a large part of an electromagnetic noise that propagates from case 9 through first main frame ground interconnection 10 is coupled to first sub frame ground interconnection 15c and second sub frame ground interconnection 16c without being spatially coupled to circuit unit 2.

An electromagnetic noise coupled to first sub frame ground interconnection 15c and second sub frame ground interconnection 16c is converted into heat in response to a conductor resistance loss at first sub frame ground interconnection 15c and second sub frame ground interconnection 16c and in response to a dielectric loss at dielectric layer 6 around first sub frame ground interconnection 15c and second sub frame ground interconnection 16c. Thus, an electromagnetic noise that propagates from case 9 containing external interface 8 to first main frame ground interconnection 10 can be inhibited from being spatially coupled to circuit unit 2. Printed circuit substrate 1c in the present embodiment can more reliably prevent circuit unit 2 from malfunctioning.

Printed circuit substrate 1c in the present embodiment includes second sub frame ground interconnection 16c in addition to first sub frame ground interconnection 15c. First sub frame ground interconnection 15c and second sub frame ground interconnection 16c can make the frequency of electromagnetic noise coupled (preferably resonantly coupled) to first sub frame ground interconnection 15c and second sub frame ground interconnection 16c different from the frequency of electromagnetic noise coupled (preferably resonantly coupled) to first sub frame ground interconnection 15 in embodiment 1. According to printed circuit substrate 1c in the present embodiment, the frequency of electromagnetic noise coupled to first sub frame ground interconnection 15c and second sub frame ground interconnection 16c can be adjusted, and an electromagnetic noise that is spatially coupled to circuit unit 2 can be further reduced. Printed circuit substrate 1c in the present embodiment can more reliably prevent circuit unit 2 from malfunctioning.

In printed circuit substrate 1c in the present embodiment, in plan view from the first direction, second sub frame ground interconnection 16c may be different in shape from first sub frame ground interconnection 15c. Making second sub frame ground interconnection 16c different in shape from first sub frame ground interconnection 15c enables adjustment of the frequency of electromagnetic noise coupled to first sub frame ground interconnection 15c and second sub frame ground interconnection 16c over a broader frequency range, and enables further reduction in electromagnetic noise that is spatially coupled to circuit unit 2. Printed circuit substrate 1c in the present embodiment can more reliably prevent circuit unit 2 from malfunctioning.

In printed circuit substrate 1c in the present embodiment, in plan view from the first direction, the second outer periphery of first sub frame ground interconnection 15c and the third outer periphery of second sub frame ground interconnection 16c are surrounded by the first outer periphery of first main frame ground interconnection 10. Circuit unit 2, first main frame ground interconnection 10, first sub frame ground interconnection 15c, and second sub frame ground interconnection 16c can be compactly arranged. Printed circuit substrate 1c in the present embodiment can be downsized.

Embodiment 5

Figure 10:
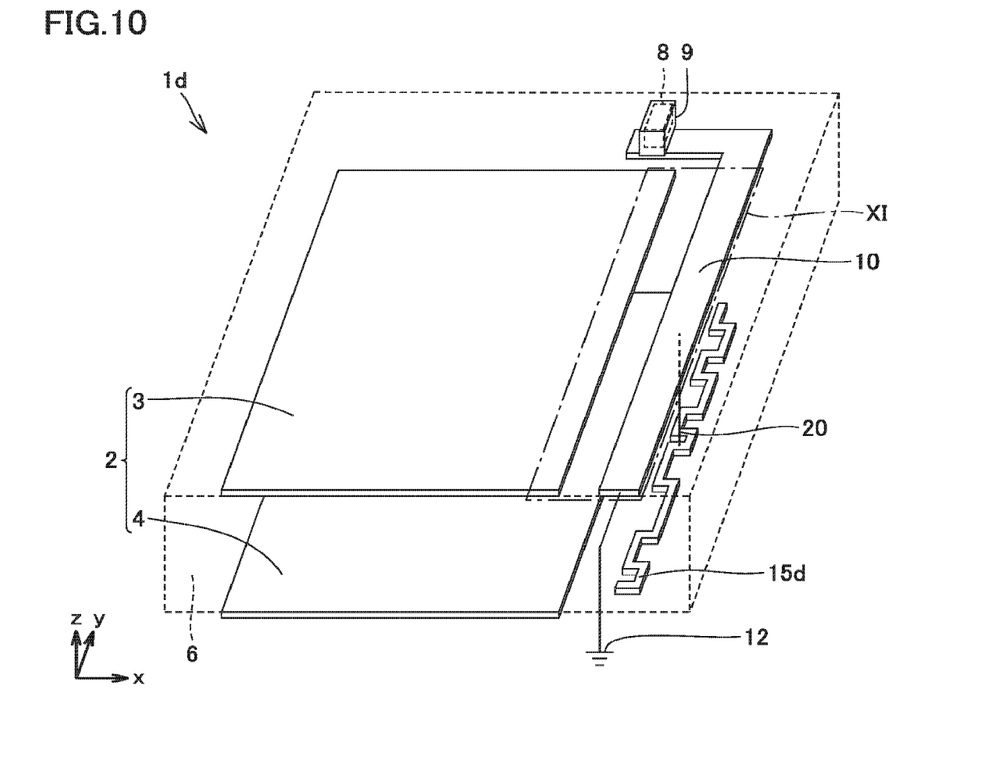
FIG. 10 is a perspective view of a printed circuit substrate according to an embodiment 5 of the present invention.
Figure 11:
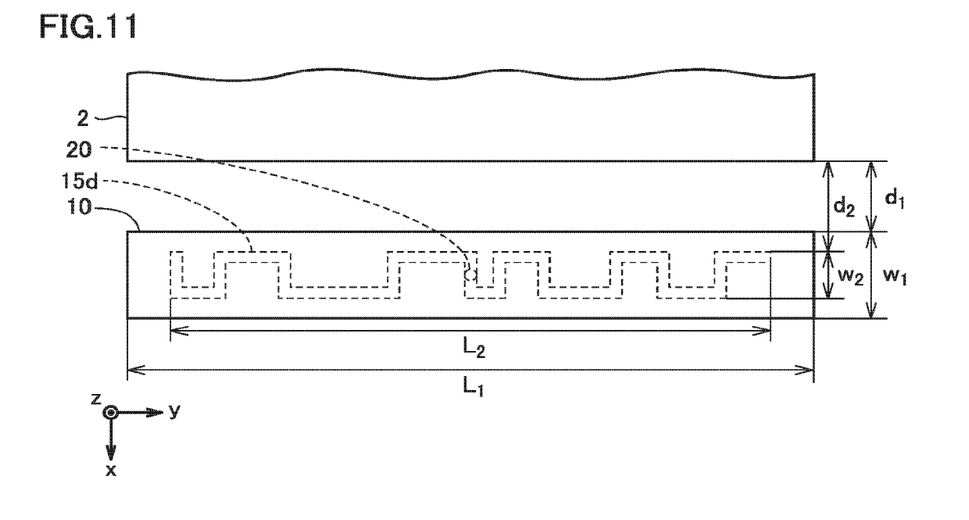
FIG. 11 is a schematic partially enlarged plan view of a region XI shown in FIG. 10 of a printed circuit substrate according to embodiment 5 of the present invention.

With reference to FIG. 10 and FIG. 11, a printed circuit substrate 1d according to embodiment 5 is described. Printed circuit substrate 1d in the present embodiment is similar in configuration to printed circuit substrate 1 in embodiment 1, but is different from the latter mainly in the following respects.

In printed circuit substrate 1d in the present embodiment, in plan view from the first direction, a first sub frame ground interconnection 15d has a meandering shape. With reference to FIG. 11, in plan view from the first direction, first sub frame ground interconnection 15d coincides in position with first main frame ground interconnection 10. In plan view from the first direction, the second outer periphery of first sub frame ground interconnection 15d is surrounded by the first outer periphery of first main frame around interconnection 10. Length $L_2$ of first sub frame ground interconnection 15d in the longitudinal direction may be shorter than length $L_1$ of first main frame ground interconnection 10 in the longitudinal direction. Width $w_2$ of first sub frame ground interconnection 15d may be narrower than width $w_1$ of first main frame ground interconnection 10.

Printed circuit substrate 1d in the present embodiment brings about the following advantageous effects in addition to the advantageous effects of printed circuit substrate 1 in embodiment 1. In printed circuit substrate 1d in the present embodiment, first sub frame ground interconnection 15d has a meandering shape. Making first sub frame ground interconnection 15d in the present embodiment different in shape from first sub frame ground interconnection 15 in embodiment 1 can make the frequency of electromagnetic noise coupled (preferably resonantly coupled) to first sub frame ground interconnection 15d different from the frequency of electromagnetic noise coupled (preferably resonantly coupled) to first sub frame ground interconnection 15 in embodiment 1. According to printed circuit substrate 1d in the present embodiment, the frequency of electromagnetic noise coupled to first sub frame ground interconnection 15d can be adjusted, and an electromagnetic noise that is spatially coupled to circuit unit 2 can be further reduced. Printed circuit substrate 1d in the present embodiment can more reliably prevent circuit unit 2 from malfunctioning.

Embodiment 6

Figure 12:
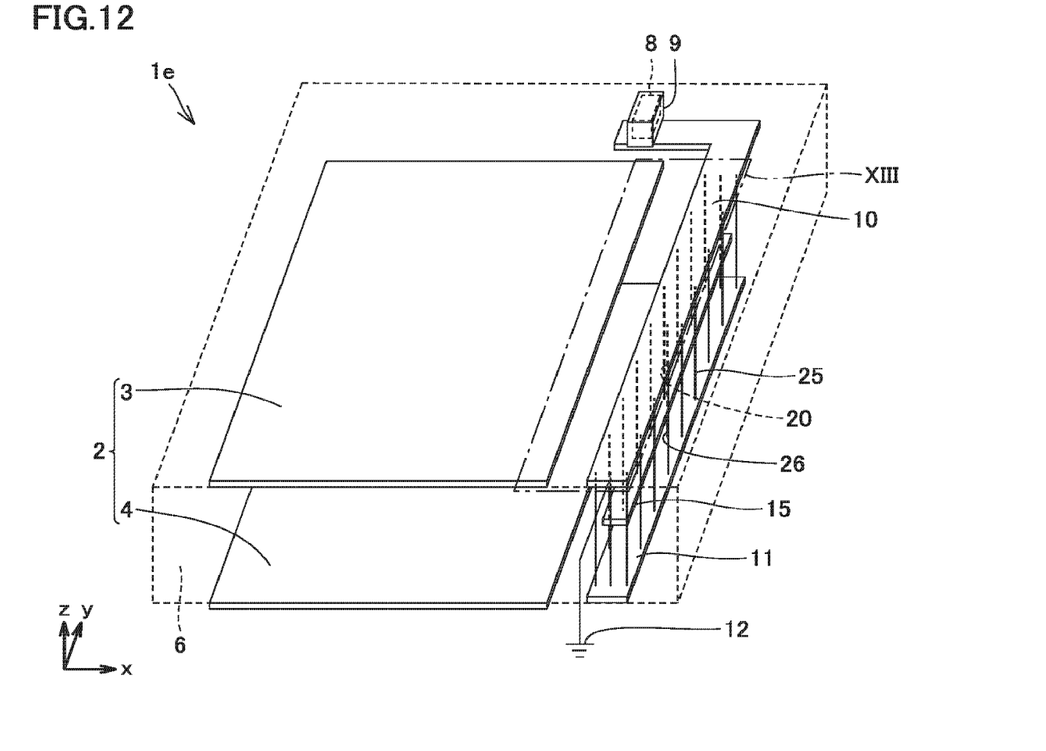
FIG. 12 is a perspective view of a printed circuit substrate according to an embodiment 6 of the present invention.
Figure 13:
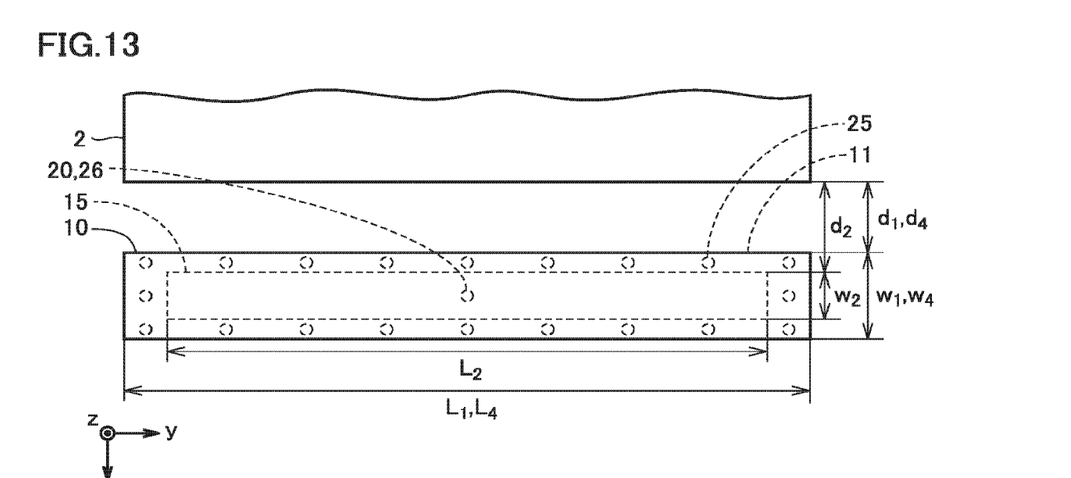
FIG. 13 is a schematic partially enlarged plan view of a region XIII shown in FIG. 12 of a printed circuit substrate according to embodiment 6 of the present invention.

With reference to FIG. 12 and FIG. 13, a printed circuit substrate 1e according to embodiment 6 is described. Printed circuit substrate 1e in the present embodiment is similar in configuration to printed circuit substrate 1 in embodiment 1, but is different from the latter mainly in the following respects.

Printed circuit substrate 1e in the present embodiment further includes a second main frame ground interconnection 11, a plurality of fourth conductive vias 25, and a fifth conductive via 26.

Second main frame ground interconnection 11 is spaced away from first sub frame ground interconnection 15 in the first direction so as to be opposite to first sub frame ground interconnection 15. As shown in FIG. 13, in plan view from the first direction, second main frame ground interconnection 11 is spaced away from circuit unit 2 at a distance of $d_4$. In plan view from the first direction, distance $d_4$ may be the same as or may be different from distance $d_1$. Second main frame ground interconnection 11 may be provided on the second surface of dielectric layer 6. Second main frame ground interconnection 11 may be coplanar with second circuit subunit 4. In plan view from the first direction, second main frame ground interconnection 11 may be disposed at a peripheral region of printed circuit substrate 1e.

Second main frame ground interconnection 11 is configured so that the coupling of electromagnetic noise from first main frame ground interconnection 10 to second main frame ground interconnection 11 is weaker than the coupling of electromagnetic noise from first main frame ground interconnection 10 to first sub frame ground interconnection 15. By appropriately determining, for example, length $L_2$ and width $w_2$ of first sub frame ground interconnection 15, length $L_4$ and width $w_4$ of second main frame ground interconnection 11, the position of first sub frame ground interconnection 15 relative to first main frame ground interconnection 10, the position of second main frame ground interconnection 11 relative to first main frame ground interconnection 10, and the positions of first conductive via 20, fourth conductive vias 25, and fifth conductive via 26, the coupling of electromagnetic noise from first main frame ground interconnection 10 to second main frame ground interconnection 11 can be made weaker than the coupling of electromagnetic noise from first main frame ground interconnection 10 to first sub frame ground interconnection 15.

In plan view from the first direction, second main frame ground interconnection 11 may be different from or may be the same as first main frame ground interconnection 10 in shape. In plan view from the first direction, second main frame ground interconnection 11 may be different from or may be the same as first main frame ground interconnection 10 in area. In plan view from the first direction, a fourth outer periphery of second main frame ground interconnection 11 may or may not coincide in position with the first outer periphery of first main frame ground interconnection 10.

First sub frame ground interconnection 15 is disposed between first main frame ground interconnection 10 and second main frame ground interconnection 11. In particular, first sub frame ground interconnection 15 may be located intermediate between first main frame ground interconnection 10 and second main frame ground interconnection 11 in the first direction. First sub frame ground interconnection 15 may be embedded in dielectric layer 6. First sub frame ground interconnection 15 may be disposed at an intermediate portion of dielectric layer 6 in the first direction.

With reference to FIG. 13, in plan view from the first direction, first sub frame ground interconnection 15 coincides in position with first main frame ground interconnection 10 and second main frame ground interconnection 11. In plan view from the first direction, the second outer periphery of first sub frame ground interconnection 15 is surrounded by the first outer periphery of first main frame ground interconnection 10 and by the fourth outer periphery of second main frame ground interconnection 11. In plan view from the first direction, first sub frame ground interconnection 15 is spaced away from circuit unit 2 at a distance of $d_2$. Distance $d_2$ may be larger than distance $d_1$ and distance $d_4$. Length $L_2$ of first sub frame ground interconnection 15 in the longitudinal direction may be shorter than length $L_1$ of first main frame ground interconnection 10 in the longitudinal direction and than length $L_4$ of second main frame ground interconnection 11 in the longitudinal direction. Width $w_2$ of first sub frame ground interconnection 15 may be narrower than width $w_1$ of first main frame ground interconnection 10 and than width $w_4$ of second main frame ground interconnection 11.

In plan view from the first direction, first sub frame ground interconnection 15 may be different in shape from each of first main frame ground interconnection 10 and second main frame ground interconnection 11. In plan view from the first direction, first sub frame ground interconnection 15 may be smaller in area than each of first main frame ground interconnection 10 and second main frame ground interconnection 11.

A plurality of fourth conductive vias 25 connect first main frame ground interconnection 10 and second main frame ground interconnection 11 to each other. A plurality of fourth conductive vias 25 are spaced away from first sub frame ground interconnection 15 and circuit unit 2. A plurality of fourth conductive vias 25 may connect a first peripheral edge portion of first main frame ground interconnection 10 and a second peripheral edge portion of second main frame ground interconnection 11 to each other. A plurality of fourth conductive vias 25 may be formed so as to pass through dielectric layer 6. In plan view from the first direction, a plurality of fourth conductive vias 25 may surround first sub frame ground interconnection 15 and first conductive via 20. A plurality of fourth conductive vias 25 may further surround fifth conductive via 26.

Fifth conductive via 26 connects first sub frame ground interconnection 15 and second main frame ground interconnection 11 to each other. In plan view from the first direction, fifth conductive via 26 may coincide in position with first conductive via 20. Fifth conductive via 26 may be integrated with first conductive via 20.

Printed circuit substrate 1e in the present embodiment brings about the following advantageous effects in addition to the advantageous effects of printed circuit substrate 1 in embodiment 1.

Printed circuit substrate 1e in the present embodiment further includes second main frame ground interconnection 11 and a plurality of fourth conductive vias 25. Second main frame ground interconnection 11 is spaced away from first sub frame ground interconnection 15 in the first direction so as to be opposite to first sub frame ground interconnection 15. A plurality of fourth conductive vias 25 connect first main frame ground interconnection 10 and second main frame ground interconnection 11 to each other. First sub frame ground interconnection 15 is disposed between first main frame ground interconnection 10 and second main frame ground interconnection 11. In plan view from the first direction, the second outer periphery of first sub frame ground interconnection 15 is surrounded by the first outer periphery of first main frame ground interconnection 10 and by the fourth outer periphery of second main frame ground interconnection 11. In plan view from the first direction, a plurality of fourth conductive vias 25 surround first sub frame ground interconnection 15.

In printed circuit substrate 1e in the present embodiment, in plan view from the first direction, the second outer periphery of first sub frame ground interconnection 15 is surrounded by the first outer periphery of first main frame ground interconnection 10 and by the fourth outer periphery of second main frame ground interconnection 11. In plan view from the first direction, a plurality of fourth conductive vias 25 surround first sub frame ground interconnection 15. Accordingly, an electromagnetic noise that is coupled to first sub frame ground interconnection 15 can be blocked by first main frame ground interconnection 10 and second main frame ground interconnection 11. According to printed circuit substrate 1e in the present embodiment, an electromagnetic noise that is spatially coupled to circuit unit 2 can be further reduced. Printed circuit substrate 1e in the present embodiment can more reliably prevent circuit unit 2 from malfunctioning.

In printed circuit substrate 1e in the present embodiment, in plan view from the first direction, the second outer periphery of first sub frame ground interconnection 15 is surrounded by the first outer periphery of first main frame ground interconnection 10 and by the fourth outer periphery of second main frame ground interconnection 11. Circuit unit 2, first main frame ground interconnection 10, first sub frame ground interconnection 15, and second main frame ground interconnection 11 can be compactly arranged. Printed circuit substrate 1e in the present embodiment can be downsized.

Printed circuit substrate 1e in the present embodiment further includes fifth conductive via 26. Fifth conductive via 26 connects first sub frame ground interconnection 15 and second main frame ground interconnection 11 to each other. Fifth conductive via 26 can change the frequency of electromagnetic noise coupled to first sub frame ground interconnection 15. According to printed circuit substrate 1e in the present embodiment, the frequency of electromagnetic noise coupled to first sub frame ground interconnection 15 can be adjusted, and an electromagnetic noise that is spatially coupled to circuit unit 2 can be further reduced. Printed circuit substrate 1e in the present embodiment can more reliably prevent circuit unit 2 from malfunctioning.

Embodiment 7

Figure 14:
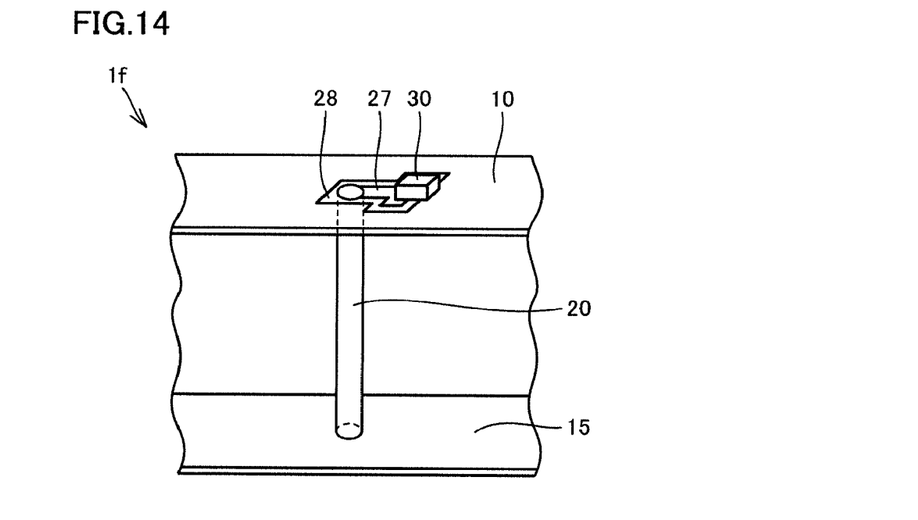
FIG. 14 is a partially enlarged perspective view of a printed circuit substrate according to an embodiment 7 of the present invention.

With reference to FIG. 14, a printed circuit substrate 1f according to embodiment 7 is described. Printed circuit substrate 1f in the present embodiment is similar in configuration to printed circuit substrate 1 in embodiment 1, but is different from the latter mainly in the following respects.

Printed circuit substrate 1f in the present embodiment further includes a first electronic component 30. First electronic component 30 may be, but is not limited to, a varistor or an arrester, for example.

In printed circuit substrate 1f in the present embodiment, first main frame ground interconnection 10 is connected to first conductive via 20 through first electronic component 30. In particular, an insulating portion 28 electrically insulates first conductive via 20 from first main frame ground interconnection 10. Insulating portion 28 may be formed by, for example, air or an insulator. First electronic component 30 is disposed so as to straddle insulating portion 28. First electronic component 30 electrically connects first conductive via 20 to first main frame ground interconnection 10.

In further particular, first conductive via 20 is connected to a conductive portion 27. Conductive portion 27 may be made of the same material as first main frame ground interconnection 10, such as copper or aluminum. Insulating portion 28 electrically insulates first conductive via 20 and conductive portion 27 from first main frame ground interconnection 10. First electronic component 30 is disposed so as to straddle insulating portion 28. First electronic component 30 may electrically connect first conductive via 20 and conductive portion 27 to first main frame ground interconnection 10.

Printed circuit substrate 1f in the present embodiment brings about the following advantageous effects in addition to the advantageous effects of printed circuit substrate 1 in embodiment 1.

Printed circuit substrate 1f in the present embodiment further includes first electronic component 30. First main frame ground interconnection 10 is connected to first conductive via 20 through first electronic component 30. First electronic component 30 can make the frequency of electromagnetic noise coupled (preferably resonantly coupled) to first sub frame ground interconnection 15 different from the frequency of electromagnetic noise coupled (preferably resonantly coupled) to first sub frame ground interconnection 15 in embodiment 1. According to printed circuit substrate 1f in the present embodiment, the frequency of electromagnetic noise coupled to first sub frame ground interconnection 15 can be adjusted, and an electromagnetic noise that is spatially coupled to circuit unit 2 can be further reduced. Printed circuit substrate 1f in the present embodiment can more reliably prevent circuit unit 2 from malfunctioning.

Printed circuit substrate 1f in the present embodiment further includes first electronic component 30. First electronic component 30 can change the electrical function of printed circuit substrate 1f in the present embodiment. Printed circuit substrate 1f in the present embodiment is different in electrical function from printed circuit substrate 1 in embodiment 1.

Embodiment 8

Figure 15:
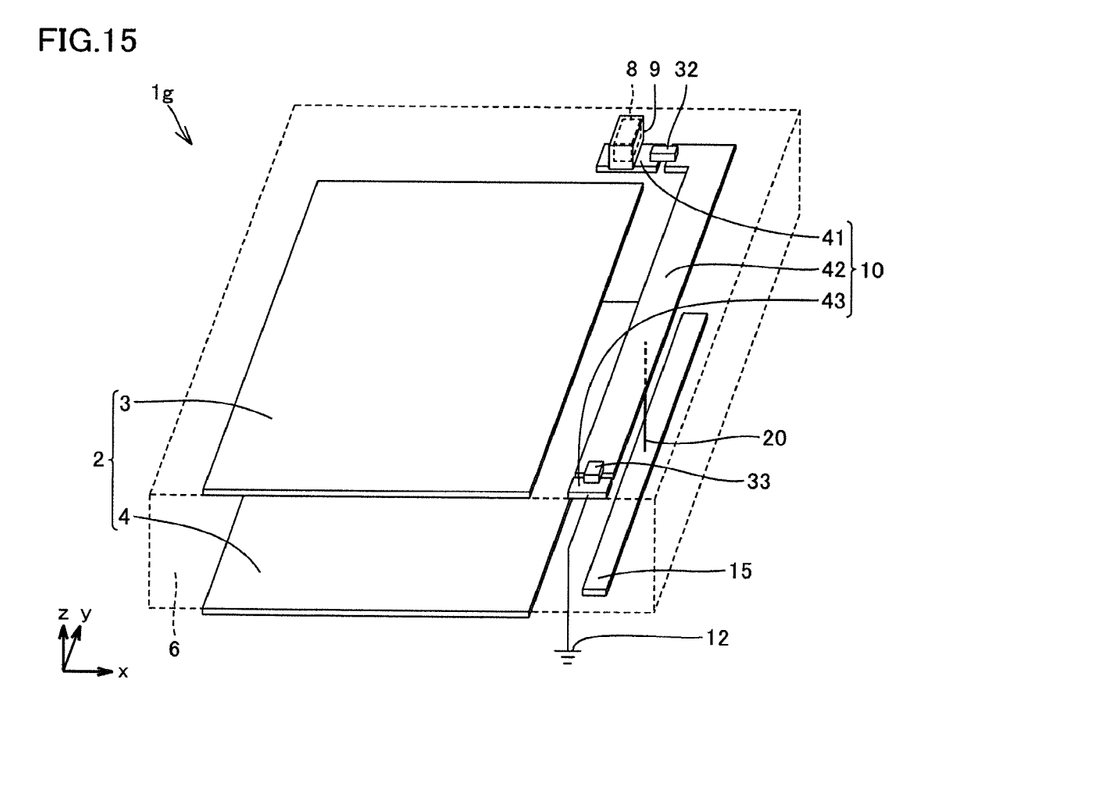
FIG. 15 is a perspective view of a printed circuit substrate according to an embodiment 8 of the present invention.

With reference to FIG. 15, a printed circuit substrate 1g according to embodiment 8 is described. Printed circuit substrate 1g in the present embodiment is similar in configuration to printed circuit substrate 1 in embodiment 1, but is different from the latter mainly in the following respects.

Printed circuit substrate 1g in the present embodiment further includes second electronic components 32, 33. Each of second electronic components 32, 33 may be, but is not limited to, a varistor or an arrester, for example. Second electronic component 33 may be the same as or may be different from second electronic component 32.

In printed circuit substrate 1g in the present embodiment, first main frame ground interconnection 10 includes a first main frame ground interconnection portion 41, a second main frame ground interconnection portion 42, and a third main frame ground interconnection portion 43. First main frame ground interconnection portion 41 is electrically connected to case 9. Second main frame ground interconnection portion 42 is spaced away from first main frame ground interconnection portion 41. Third main frame ground interconnection portion 43 is spaced away from second main frame ground interconnection portion 42. Third main frame ground interconnection portion 43 is electrically connected to stable electric potential 12.

First main frame ground interconnection portion 41 is connected to second main frame ground interconnection portion 42 through second electronic component 32. Second electronic component 32 may be disposed between one end (the end on the case 9 side) of first main frame ground interconnection 10 and the portion of first main frame ground interconnection 10 that is connected to first conductive via 20.

Second main frame ground interconnection portion 42 is connected to third main frame ground interconnection portion 43 through second electronic component 33. Second electronic component 33 may be disposed between the portion of first main frame ground interconnection 10 that is connected to first conductive via 20, and the other end (the end on the stable electric potential 12 side) of first main frame ground interconnection 10.

Printed circuit substrate 1g in the present embodiment brings about the following advantageous effects in addition to the advantageous effects of printed circuit substrate 1 in embodiment 1.

Printed circuit substrate 1g in the present embodiment further includes second electronic component 32 (second electronic component 33). First main frame ground interconnection 10 includes first main frame ground interconnection portion 41 (second main frame ground interconnection portion 42), and includes second main frame ground interconnection portion 42 (third main frame ground interconnection portion 43) spaced away from first main frame ground interconnection portion 41 (second main frame ground interconnection portion 42). First main frame ground interconnection portion 41 (second main frame ground interconnection portion 42) is connected to second main frame ground interconnection portion 42 (third main frame ground interconnection portion 43) through second electronic component 32 (second electronic component 33).

Second electronic component 32 (second electronic component 33) can make the frequency of electromagnetic noise coupled (preferably resonantly coupled) to first sub frame ground interconnection 15 different from the frequency of electromagnetic noise coupled (preferably resonantly coupled) to first sub frame ground interconnection 15 in embodiment 1. According to printed circuit substrate 1g in the present embodiment, the frequency of electromagnetic noise coupled to first sub frame ground interconnection 15 can be adjusted, and an electromagnetic noise that is spatially coupled to circuit unit 2 can be further reduced. Printed circuit substrate 1g in the present embodiment can more reliably prevent circuit unit 2 from malfunctioning.

Printed circuit substrate 1g in the present embodiment further includes second electronic components 32, 33. Second electronic components 32, 33 can change the electrical function of printed circuit substrate 1g in the present embodiment. Printed circuit substrate 1g in the present embodiment is different in electrical function from printed circuit substrate 1 in embodiment 1.

It should be understood that embodiments 1 to 8 disclosed herein are illustrative in every respect, not limitative. At least two of embodiments 1 to 8 disclosed herein may be combined if compatible. The scope of the present invention is defined not by the above description but by the terms of the claims, and is intended to include any modification within the meaning and scope equivalent to the terms of the claims.

REFERENCE SIGNS LIST 1, 1a, 1b, 1c, 1d, 1e, 1f, 1g: printed circuit substrate; 2: circuit unit; 3: first circuit subunit; 4: second circuit subunit; 6: dielectric layer; 8: external interface; 9: case; 10: first main frame ground interconnection; 11: second main frame ground interconnection; 12: stable electric potential; 15, 15a, 15c, 15d: first sub frame ground interconnection; 16, 16c: second sub frame ground interconnection; 20: first conductive via; 21: second conductive via; 22, 22c: third conductive via; 25: fourth conductive via; 26: fifth conductive via; 27: conductive portion; 28: insulating portion; 30: first electronic component; 32, 33: second electronic component; 41: first main frame ground interconnection portion; 42: second main frame ground interconnection portion; 43: third main frame ground interconnection portion

The invention claimed is:

1. A printed circuit substrate comprising:
an external interface;
a case containing the external interface;
a circuit unit electrically connected to the external interface;
a first main frame ground interconnection electrically connected to the case;
a first sub frame ground interconnection spaced away from the first main frame ground interconnection in a first, direction so as to be opposite to the first main frame ground interconnection; and
a first conductive via connecting the first main frame ground interconnection and the first sub frame ground interconnection to each other,
the first sub frame ground interconnection being electrically connected to the case via the first main frame ground interconnection and first conductive via,
the circuit unit being spaced away from the first main frame ground interconnection, the first sub frame ground interconnection, and the first conductive via in a second direction intersecting the first direction, in plan view from the first direction, a second outer periphery of the first sub frame ground interconnection being surrounded by a first outer periphery of the first main frame ground interconnection, the first sub frame ground interconnection being configured so that an electromagnetic noise propagating on the first main frame ground interconnection is resonantly coupled to the first sub frame ground interconnection.

2. The printed circuit substrate according to claim 1, further comprising a second conductive via connecting the first main frame ground interconnection and the first sub frame ground interconnection to each other.

3. The printed circuit substrate according to claim 1, further comprising:

a second sub frame ground interconnection spaced away from the first sub frame ground interconnection in the first direction so as to be opposite to the first sub frame ground interconnection; and a third conductive via connecting the first sub frame ground interconnection and the second sub frame ground interconnection to each other, the first sub frame ground interconnection being disposed between the first main frame ground interconnection and the second sub frame ground interconnection, in the plan view from the first direction, a third outer periphery of the second sub frame ground interconnection being surrounded by the first outer periphery of the first main frame ground interconnection.

4. The printed circuit substrate according to claim 1, further comprising:

a second sub frame ground interconnection spaced away from the first main frame ground interconnection in the first direction so as to be opposite to the first main frame ground interconnection; and a third conductive via connecting the first main frame ground interconnection and the second sub frame ground interconnection to each other, the second sub frame ground interconnection being spaced away from the first sub frame ground interconnection in a third direction intersecting the first direction and the second direction, in the plan view from the first direction, a third outer periphery of the second sub frame ground interconnection being surrounded by the first outer periphery of the first main frame ground interconnection.

5. The printed circuit substrate according to claim 3, wherein, in the plan view from the first direction, the second sub frame ground interconnection is different in shape from the first sub frame ground interconnection.

6. The printed circuit substrate according to claim further comprising:

a second main frame ground interconnection spaced away from the first sub frame ground interconnection in the first direction so as to be opposite to the first sub frame ground interconnection; and a plurality of fourth conductive vias connecting the first main frame ground interconnection and the second main frame ground interconnection to each other, the first sub frame ground interconnection being disposed between the first main frame ground interconnection and the second main frame ground interconnection, in the plan view from the first direction, the second outer periphery of the first sub frame ground interconnection being surrounded by a fourth outer periphery of the second main frame ground interconnection, in the plan view from the first direction, the plurality of fourth conductive vias surrounding the first sub frame ground interconnection.

7. The printed circuit substrate according to claim 6, further comprising a fifth conductive via connecting the first sub frame ground interconnection and the second main frame ground interconnection to each other.

8. The printed circuit substrate according to claim 1, wherein the first sub frame ground interconnection has a meandering shape.

9. The printed circuit substrate according to claim 1, further comprising a first electronic component, the first main frame ground interconnection being connected to the first conductive via through the first electronic component.

10. The printed circuit substrate according to claim 1, further comprising a second electronic component, the first main frame ground interconnection including:
a first main frame ground interconnection portion; and
a second main frame around interconnection portion spaced away from the first main frame ground interconnection portion, the first main frame ground interconnection portion being connected to the second main frame ground interconnection portion through the second electronic component.

* * * * *